United States Patent
Herdendorf et al.

(10) Patent No.: US 12,113,310 B2
(45) Date of Patent: Oct. 8, 2024

(54) CONNECTORS USING SHAPE MEMORY ALLOY

(71) Applicant: Seagate Technology LLC, Fremont, CA (US)

(72) Inventors: Brett R. Herdendorf, Mound, MN (US); Riyan Alex Mendonsa, Edina, MN (US); Wolfgang Rosner, Shakopee, MN (US); Krishnan Subramanian, Shakopee, MN (US)

(73) Assignee: Seagate Technology LLC, Fremont, CA (US)

( * ) Notice: Subject to any disclaimer, the term of this patent is extended or adjusted under 35 U.S.C. 154(b) by 480 days.

(21) Appl. No.: 17/108,567

(22) Filed: Dec. 1, 2020

(65) Prior Publication Data

US 2022/0173539 A1  Jun. 2, 2022

(51) Int. Cl.
*H01R 12/85* (2011.01)
*H01R 4/01* (2006.01)
*H05K 3/32* (2006.01)

(52) U.S. Cl.
CPC ............. *H01R 12/856* (2013.01); *H01R 4/01* (2013.01); *H05K 3/325* (2013.01)

(58) Field of Classification Search
None
See application file for complete search history.

(56) References Cited

U.S. PATENT DOCUMENTS

| | | | |
|---|---|---|---|
| 3,727,173 A * | 4/1973 | Goldmann | H01R 4/01 439/267 |
| 4,734,047 A | 3/1988 | Krumme | |
| 4,784,854 A | 11/1988 | Seguin et al. | |
| 4,846,729 A | 7/1989 | Hikami et al. | |
| 4,881,908 A | 11/1989 | Perry et al. | |
| 5,044,980 A | 9/1991 | Krumme et al. | |
| 5,092,781 A | 3/1992 | Casciotti et al. | |
| 5,154,625 A | 10/1992 | Borokowski et al. | |
| 5,171,154 A | 12/1992 | Casciotti et al. | |
| 5,334,031 A | 8/1994 | Schmidt | |
| 6,116,915 A | 9/2000 | McDaniel et al. | |
| 6,416,335 B1 | 7/2002 | Horchler | |
| 6,447,317 B1 * | 9/2002 | Billman | H01R 13/6582 439/260 |
| 6,524,114 B2 * | 2/2003 | Watanabe | H01R 12/721 439/260 |
| 6,974,339 B2 | 12/2005 | Kuzmenka | |
| 7,556,510 B2 | 7/2009 | Tsuruzawa et al. | |
| 9,929,485 B2 | 3/2018 | Jandt et al. | |
| 9,934,885 B2 * | 4/2018 | Broughton | H01B 7/282 |
| 2019/0232370 A1 | 8/2019 | Bokkes | |

\* cited by examiner

*Primary Examiner* — Felix O Figueroa
(74) *Attorney, Agent, or Firm* — Mueting Raasch Group

(57) ABSTRACT

Connector devices or connectors for use in interconnection to a circuit board may be configured in an open or closed configuration. The connectors devices may utilize a shape memory alloy (SMA) actuator to move clamping portions with respect to each other into one or both of the open or closed positions.

10 Claims, 6 Drawing Sheets

CONNECTORS USING SHAPE MEMORY ALLOY

The disclosure herein relates to connectors using shape memory alloy (SMA), and further to systems, devices, and apparatus related to such connectors.

SUMMARY

One illustrative a device including first and second clamping portions pivotally coupled to each other and a shape memory alloy (SMA) actuator operably coupling the first and second clamping portions to pivotally move the first and second clamping portions into the open position. At least one of the first and second clamping portions may include a plurality of interconnect contacts to contact a plurality of board contacts of an insertable circuit board. The first and second clamping portions may be pivotally spaced away from each other to allow insertion of the insertable circuit board therebetween in an open position, and the first and second clamping portions may be pivotally spaced closer to each other than when in the open position to contact both sides of the insertable circuit board positioned therebetween in a closed position.

One illustrative system may include a chassis defining a plurality of slots and each slot is configured to receive a device. The system further includes a plurality of connectors and each connector may be located proximate a corresponding slot to be connected to a corresponding device received in the corresponding slot. Further, each device connector may include first and second clamping portions pivotally coupled to each other, where at least one of the first and second clamping portions comprises a plurality of interconnect contacts to contact a plurality of board contacts of an insertable circuit board of the corresponding device. The first and second clamping portions may be pivotally spaced away from each other to allow insertion of the insertable circuit board therebetween in an open position, and the first and second clamping portions may be pivotally spaced closer to each other than when in the open position to contact both sides of the insertable circuit board positioned therebetween in a closed position. Each device connector may further include a shape memory alloy (SMA) actuator operably coupling the first and second clamping portions to pivotally move the first and second clamping portions into the open position.

One illustrative device may include first and second clamping portions pivotally coupled to each other and at least one of the first and second clamping portions may include a plurality of interconnect contacts to contact a plurality of board contacts of an insertable circuit board. The first and second clamping portions may be pivotally spaced away from each other to allow insertion of the insertable circuit board therebetween in an open position and the first and second clamping portions may be pivotally spaced closer to each other than when in the open position to contact both sides of the insertable circuit board positioned therebetween in a closed position. The device may further include one or more springs to bias first and second clamping portions into the closed position and an actuator operably coupling the first and second clamping portions to pivotally move the first and second clamping portions into the open position.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings.

DETAILED DESCRIPTION

Figure 1:
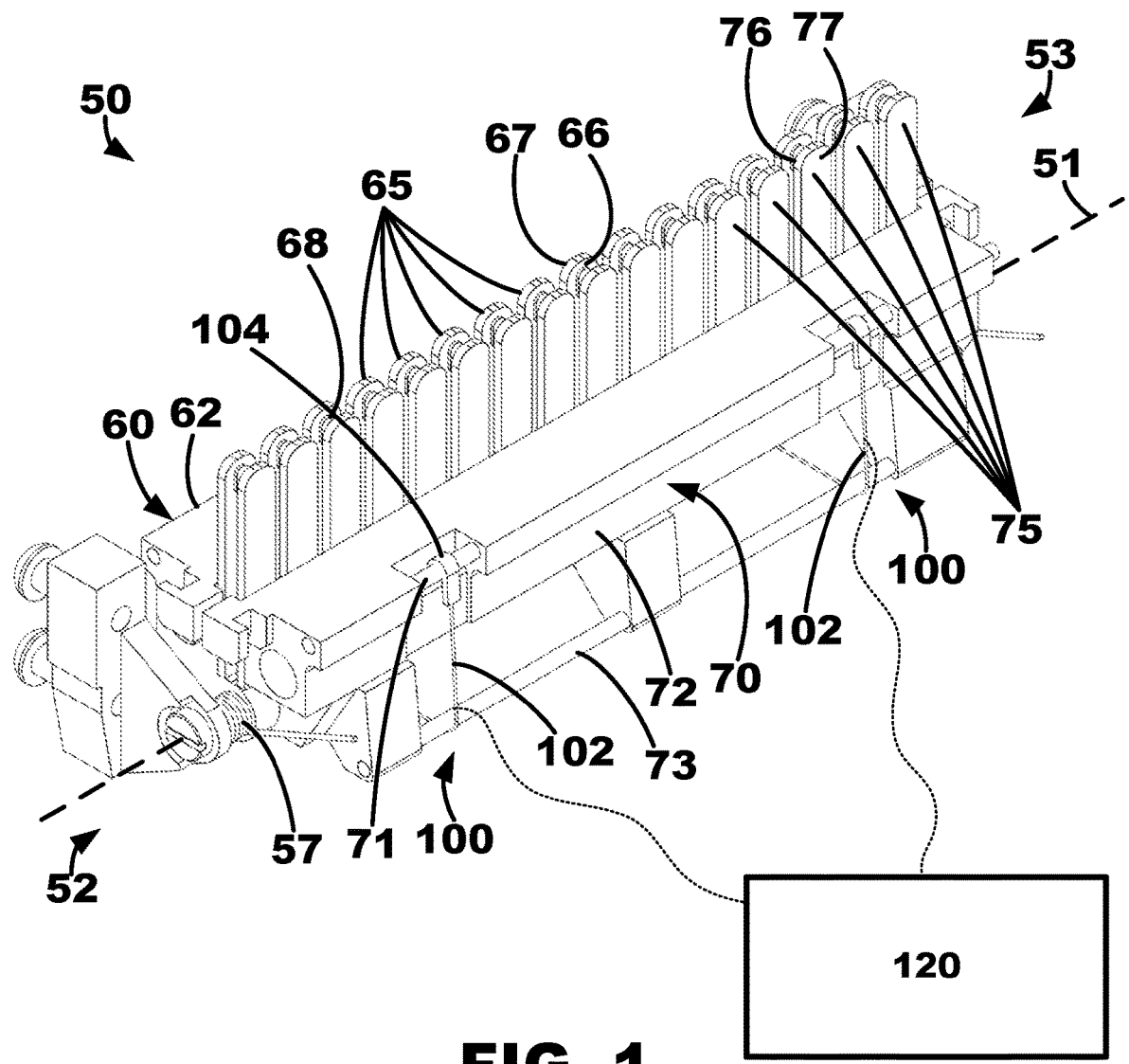
FIG. 1 is a perspective view of an illustrative connector device.
Figure 2:
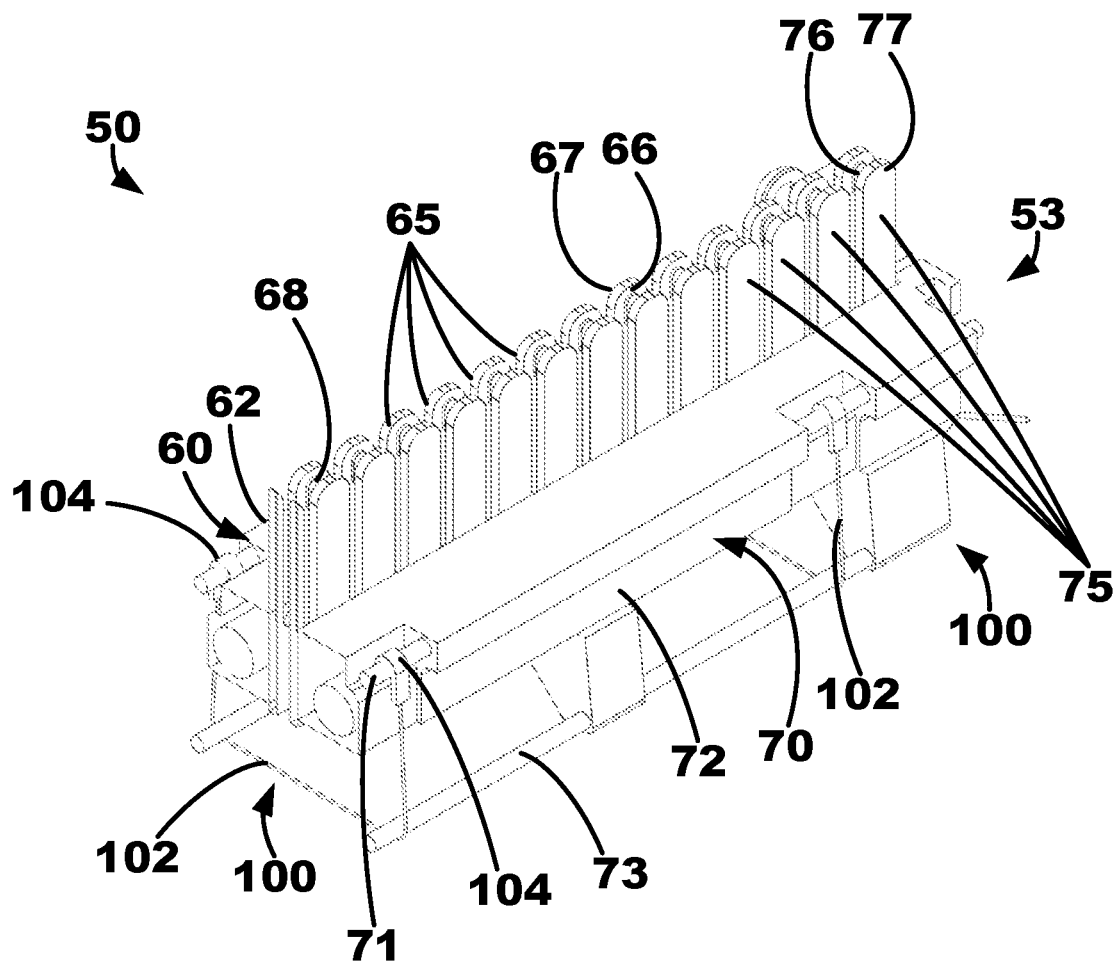
FIG. 2 is a cross-sectional perspective view of the connector device of FIG. 1.

Illustrative connectors, connector devices, systems, and chassis apparatus shall be described with reference to FIGS. 1-5. It will be apparent to one skilled in the art that elements or processes from one embodiment may be used in combination with elements or processes of the other embodiments, and that the possible embodiments of such connectors, connector devices, systems, and chassis apparatus using combinations of features set forth herein is not limited to the specific embodiments shown in the figures and/or described herein. Further, it will be recognized that the size and shape of various elements herein may be modified but still fall within the scope of the present disclosure, although certain one or more shapes and/or sizes, or types of elements, may be advantageous over others.

As global storage needs increase, and the need for archival storage increases, the need for alternative technologies and cost reduction over the lifetime of data storage are important. Further, current hard-disk drives have opportunities for further cost reduction, both in initial cost and cost over lifetime. For these purposes, drive cartridges or carriers without a printed circuit board assemblies (PCBA) may reduce the cost but may require a cost-effective low-profile interconnect as well.

It may be described that the present disclosure describes an interconnect that utilizes a shape-memory alloy for connection to various drive interconnects, drive cartridge interconnects, or carrier interconnects such as cost-effective, low-profile interconnects. In at one embodiment, an illustrative connector, or interconnect device includes clamping portions formed of or comprising a slotted glass fiber reinforced (fiberglass) epoxy resin or flex circuit with a metal backing of high elastic modulus, with a possibility for copper foil bonded onto the connecting side, and on top of the copper in the area of connection, there may be plated bumps. which are then coated with gold or high-density gold contacts, such that they provide environmental protection and are dense enough to allow sufficient cycles for the lifetime of the device. In another alternative constructions, surface-mounted gold-plated contact pads may be used.

Further, although one example describes herein utilizes fiberglass, it is to be understood that the fiberglass can be replaced by other materials or combination.

One illustrative system described herein makes use of one or more SMA wires for actuation of the clamping interconnect mechanism. This type of interconnect is low cost and low profile. Additionally, it is easier to control the impedance and capacitance of the different signal lines controlling the SMA wires. Furthermore, since the interconnect mechanism is very thin, it can connect to cartridge or carrier interconnects in very small, dense areas. Thus, drive cartridges or carriers in an enclosure, chassis, or rack can be "packed," or positioned, close together so that more cartridges or carriers can be in the enclosure, chassis, or rack. Additionally, although many of the examples described herein are SMA actuated, other examples considered by this disclosure may utilize actuation of various types such as, e.g., motor drive, spring loaded, etc. In one or more embodiments, the SMA wires may also be achieved, or formed, using SMA bilayers or composites. Additionally, to enable checks to ensure good contact, extra pass-through connections can be implemented or other means of verification.

In other words, the present disclosure relates to connectors or connector devices that are configurable in an open configuration to receive an insertable circuit board of, e.g., a drive cartridge or carrier, a processing device cartridge or carrier, etc., and configurable in a closed configuration so as to be operably coupled to the insertable circuit board. The connectors or connector devices may be positioned inside of a chassis or enclosure (e.g., positioned proximate a backplane of the chassis or enclosure) that is configured to receive multiple cartridges or carriers, e.g., in rows and columns of slots.

In one or more embodiments, each connector or connector device utilizes a shape memory alloy (SMA) actuator to configure the connector or connector device in an open configuration and/or a closed configured. The SMA actuator may include one or more (e.g., two, three, a plurality, etc.) SMA portions that are operably coupled to two or more clamping portions that are movable with respect to each other using the SMA portions. In particular, a current may be provided across the SMA portions thereby providing energy or heat to the SMA portions causing the SMA portions to move to a pre-deformed state moving the clamping portions accordingly.

As described herein, the disclosure relates primarily to connectors or connectors devices that are operably connectable, or couplable, to an insertable circuit board. The insertable circuit board may be part of a processing device or storage drive that may be received by chassis, or enclosure, such that the insertable circuit board may interface with one or more circuit boards of the chassis (e.g., such as the backplane circuit board of the chassis). The devices receivable by the chassis, which have the insertable circuit board, may be data storage drives including any device and/or apparatus configured to store data (e.g., binary data, etc.). The data storage drives may include one or more storage mediums that can include, but is not necessarily limited to, solid state memory, hard magnetic discs, magnetic tapes, optical discs, integrated circuits, volatile memory, nonvolatile memory, and any combination thereof. In one or more embodiments, the devices may be computing devices such as e.g., file or storage servers, network attached storage (NAS) servers, cold storage servers, workstations, processing units comprising a plurality of processors (e.g., graphical processor units, central processing units, processing cores, etc.), etc.

The chassis may be used to removably, physically, and operably couple each of devices to other computer apparatus such as, storage area networks or other computing systems that provide an information technology service. In such cases, the devices may be mounted within a chassis, such as a rack enclosure, or otherwise mounted to a larger structure during use. Such a chassis may include a circuit board, such as a midplane or baseplane, that electrically, optically, or otherwise operably connects to the devices, for example, to transfer information and power.

The devices may include an interface to be operably coupled, or connected, to the circuit board or another equivalent structure of the chassis. For example, the industry has many types of interfaces such as, e.g., single, dual PCIe/NVMe drive, SAS, & SATA.

Reference will now be made to the drawings, which depict one or more aspects described in this disclosure. However, it will be understood that other aspects not depicted in the drawings fall within the scope and spirit of this disclosure. Like numbers used in the figures refer to like components, elements, portions, regions, openings, apertures, and the like. However, it will be understood that the use of a reference character to refer to an element in a given figure is not intended to limit the element in another figure labeled with the same reference character.

An illustrative connector device 50 is depicted in FIGS. 1-4. The connector device 50 may include a plurality of different portions or sections to provide the functionality described herein. In this example, the connector device 50 includes, among other things, a first clamping portion 60 and a second clamping portion 70. The connector device 50 extends along an axis 51 from a first end region 52 to a second end region 53.

Likewise, each of the first and second clamping portions 60, 70 extend from the first end region 52 to the second end region 53 along the axis 51. Additionally, The first and second clamping portions 60, 70 are pivotally coupled to each other about the axis 51, for example, to provide interconnection functionality with an insertable circuit board as will be described further herein.

One or both (e.g., at least one) of the first and second clamping portions 60, 70 may include a plurality of interconnect contacts, or pads, 68, 78. The interconnect contacts, or pads, 68, 78 may include one or more conductive materials such as, copper, aluminum, gold, etc. In at least one embodiment, the interconnect contacts, or pads, 68, 78 are copper and have a gold coating. Additionally, although the example described herein with reference to FIGS. 1-4 utilizes electrically conductive interconnect contacts 68, 78 for transmission of electrical signals, it is be understood that this disclosure contemplates the use of interconnect contacts that are optical, electromagnetic, or any other suitable type of connection for operable coupling to an insertable circuit board.

As shown in this embodiment, each of the first and second clamping portions 60, 70 includes a plurality of fingers 65, 75 (some of which are labeled in the figures) extending from a primary portion 62, 72. Each of the fingers 65, 75 defines an inner, or first, surface 66, 76 and an outer, or second, surface 67, 77 facing the opposite direction as the inner surface 66, 76. The interconnect contacts 68, 78 are coupled to, or positioned on the inner surfaces 66, 76 so as to be able to contact a plurality of board contacts 92 of an insertable circuit board 90 as will be described in more detail further herein.

The first and second clamping portions 60, 70 may include one or more materials so as to be able to perform the functionality described herein. For example, the first and second clamping portions 60, 70 may include one or more of fiberglass, polymers, epoxy resin, carbon fiber, etc. Further, the first and second clamping portions 60, 70 may be rigid. In one or more embodiments, the fingers 65, 75 may be less rigid than the remainder of the first and second clamping portions 60, 70 (e.g., such as the primary portions 62, 72) to provide some compliance, or deflection, when being coupled to the insertable circuit board 90 (e.g., to account for a tolerance of thicknesses of the insertable circuit board). For example, the distance between the fingers 65, 75 (when the connector device 50 is a closed position or configuration) may be slightly less than the thickness of the insertable circuit board 90 such that the fingers 65, 75 may deflect away from the insertable circuit board 90 but apply pressure thereto to ensure contact between the interconnect contacts 68, 78 and the corresponding contacts on the insertable circuit board 90. In at least one embodiment, the fingers 65, 75 may include a flex circuit with metal backing.

Figure 4A:
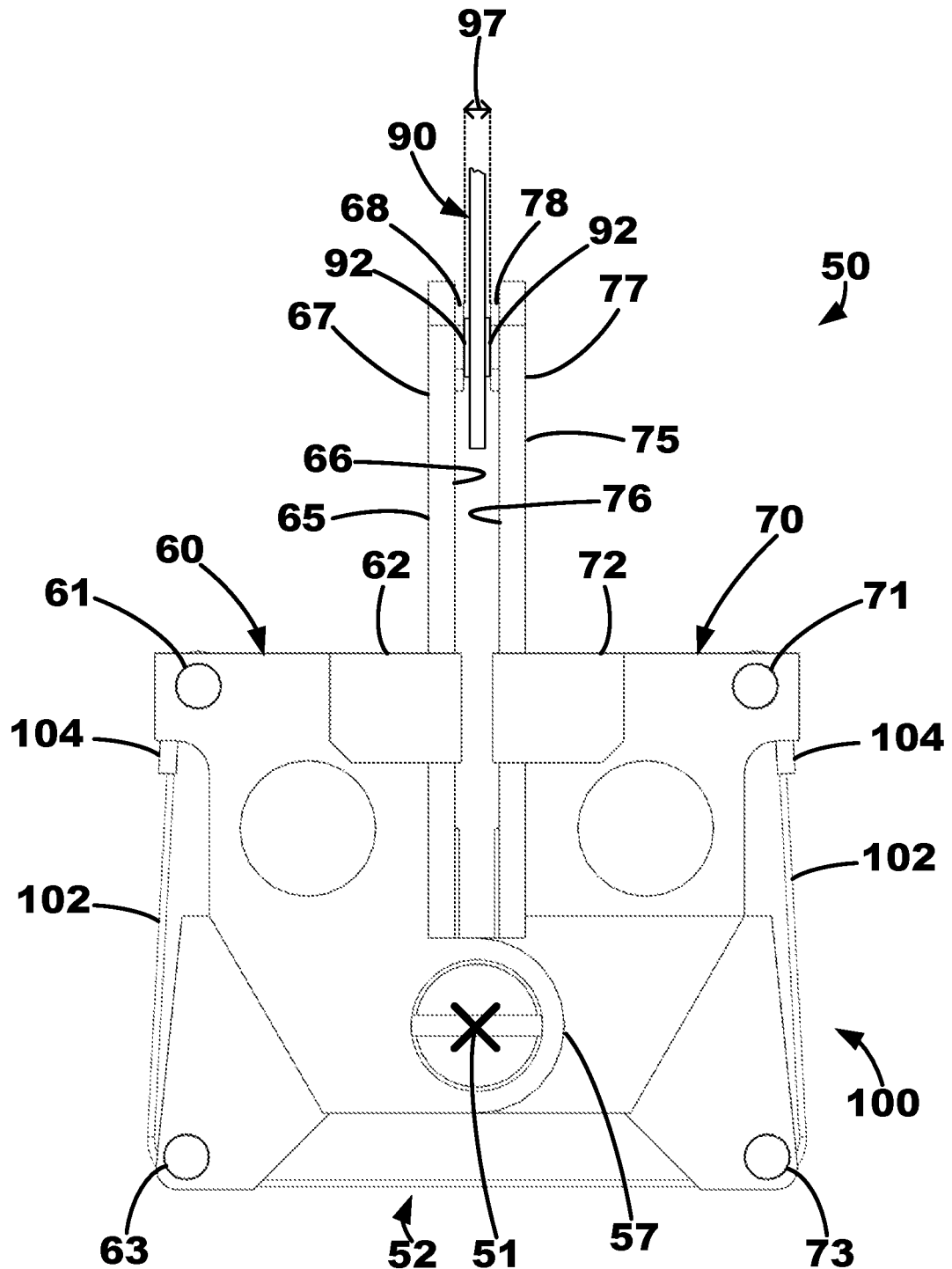
FIG. 4A is a side-view of the connector device of FIG. 1 configured in a closed position to contact both sides of an insertable circuit board.
Figure 4B:
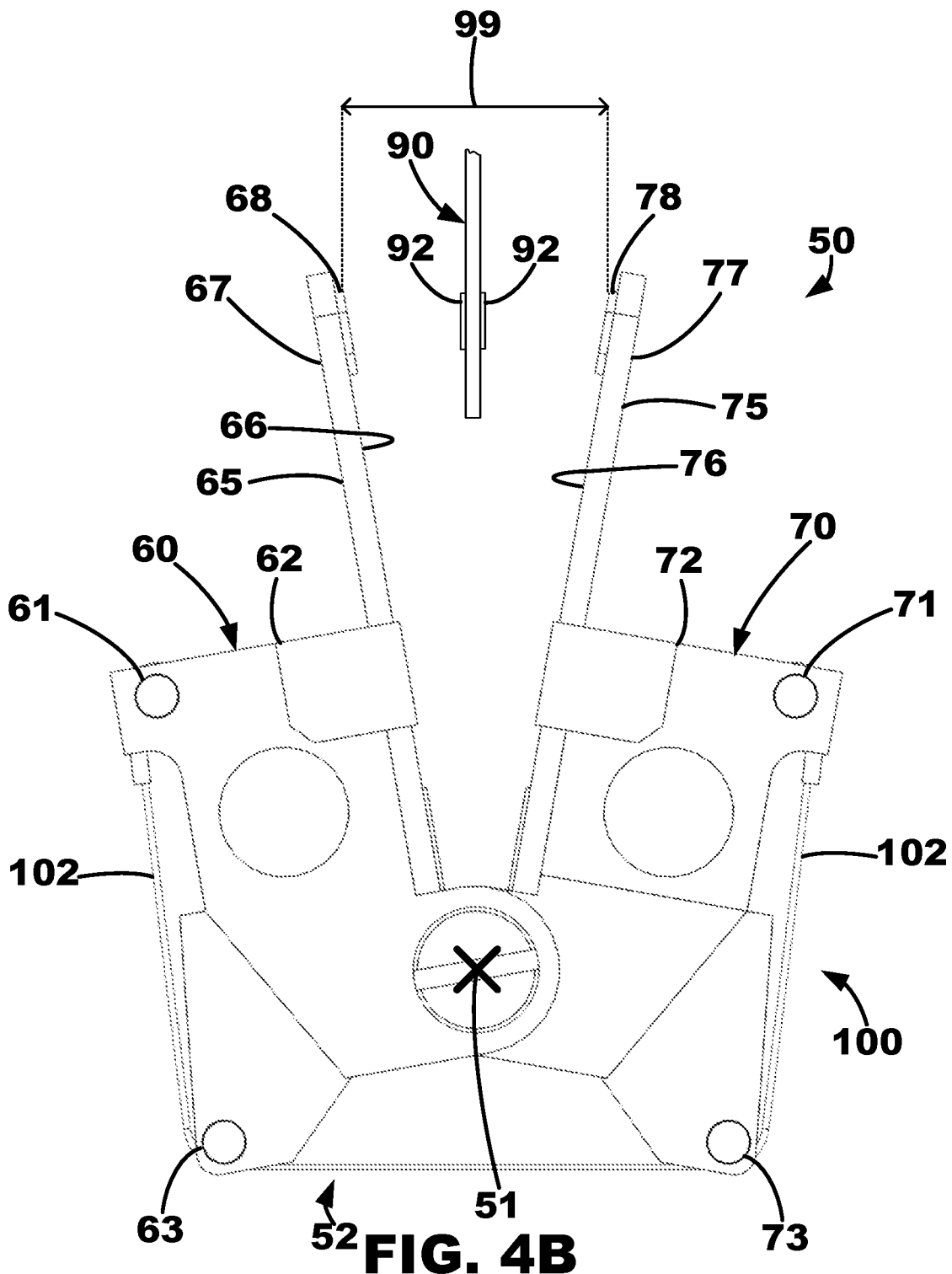
FIG. 4B is a side-view of the connector device of FIG. 1 configured in an open position.

The first and second clamping portions 60, 70 may be positioned with respect to each other in a variety of different configuration so as to be able to be operably coupled to and uncoupled from an insertable circuit board 90 located therebetween as shown in FIGS. 4A-4B. For example, the first and second clamping portions 60, 70 may be pivotally spaced away from each other to allow insertion of the insertable circuit board 90 therebetween in an open position as shown in FIG. 4B and may be pivotally spaced closer to each other than when in the open position to contact both sides of the insertable circuit board 90 positioned therebetween in the closed position as shown in FIG. 4A. Although two positions, or configurations are depicted in FIGS. 4A-4B, it is be understood that many positions may exist between the two positions shown in FIGS. 4A-4B (e.g., the two positions shown in FIGS. 4A-4B may be the extremes of the range of the positions, the position shown in FIG. 4A may be an extreme of the range of positions and the position shown in FIG. 4B may not be an extreme of the range of positions, etc.).

The open and closed positions of the first and second clamping portions 60, 70 may be described with reference to a distance 99 between the opposing the interconnect contacts 68, 78 of the fingers 65, 75. For example, the distance 99 when the first and second clamping portions 60, 70 are in the open position as shown in FIG. 4B may be greater than the distance 97 when the first and second clamping portions 60, 70 are in the closed position as shown in FIG. 4A. Conversely, the distance 97 when the first and second clamping portions 60, 70 are in the closed position as shown in FIG. 4A may be less the distance 99 when the first and second clamping portions 60, 70 are in the open positioned as shown in FIG. 4B. The distance 99 when the first and second clamping portions 60, 70 are in the open position may be between about 2 millimeters (mm) and 10 mm. For example, the distance 99 when the first and second clamping portions 60, 70 are in the open position may be greater than or equal to 2 mm, greater than or equal to 4 mm, greater than or equal to 6 mm, greater than or equal to 8 mm, etc. and/or less than or equal to 10 mm, less than or equal to 9 mm, less than or equal to 7 mm, less than or equal to 5 mm, less than or equal to 3 mm, etc. The distance 99 when the first and second clamping portions 60, 70 are in the closed position may be between about 1 mm and 4 mm. For example, the distance 99 when the first and second clamping portions 60, 70 are in the closed position may be greater than or equal to 1 mm, greater than or equal to 2 mm, etc. and/or less than or equal to 4 mm, less than or equal to 3 mm, etc.

Additionally, the distance 97, when the first and second clamping portions 60, 70 are in the closed position, may be defined, or configured, in terms of the thickness of the insertable circuit board 90. For instance, the distance 97 may be less than or equal to the thickness of the insertable circuit board 90 by a selected amount. For example, the distance 97 may be less than the thickness of the insertable circuit board 90 by about 1 mm to about 5 mm. In this way, when the first and second clamping portions 60, 70 are in the closed position, the interconnect contacts, or pads, 68, 78 will sufficiently (e.g., tightly) contact the board contacts 92 as the first and second clamping portions 60, 70 resiliently deflects.

Figure 3:
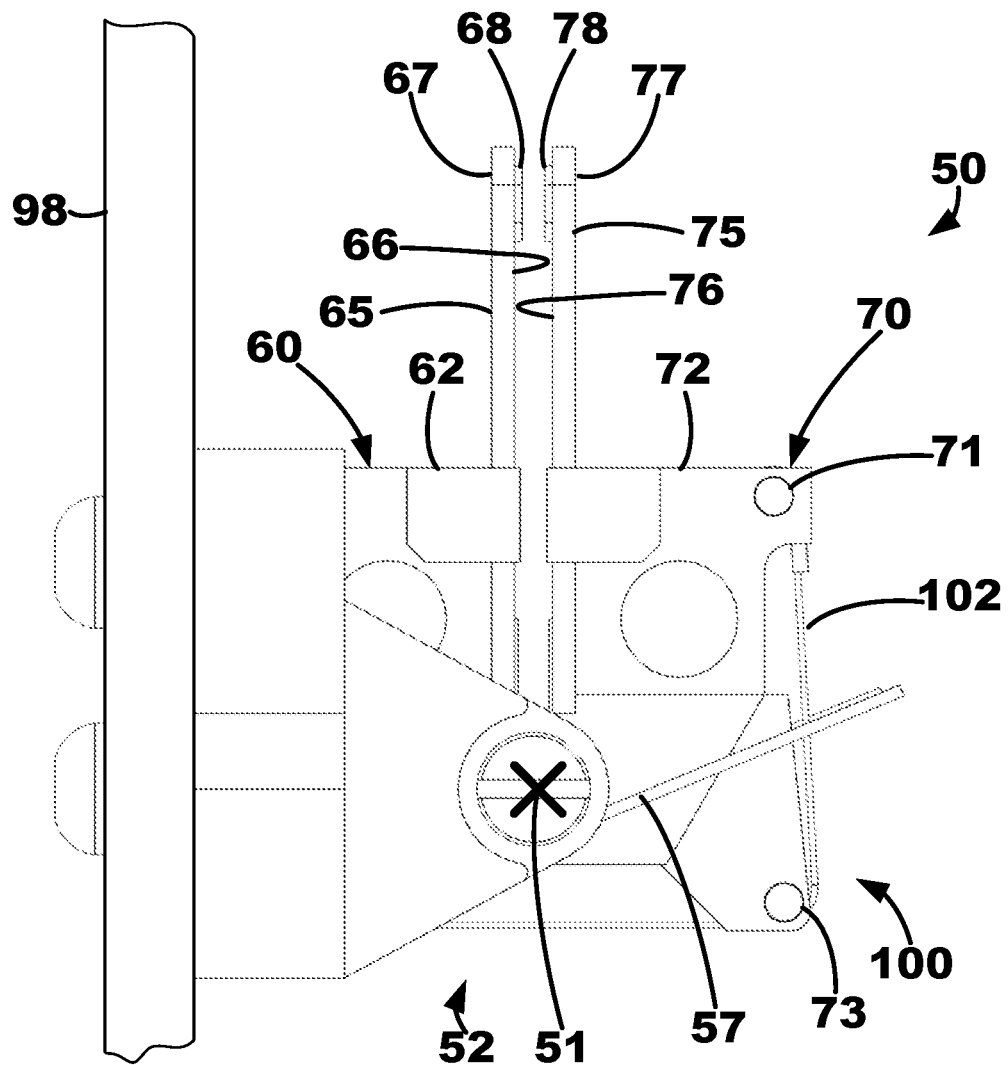
FIG. 3 is a side-view of the connector device of FIG. 1 coupled to a board.

The illustrative connector device 50 may further include apparatus configured to move the first and second clamping portions 60, 70 into and between the closed position and the open position. In the embodiment depicted in FIGS. 1-4, the connector device 50 includes two springs 57 that bias the first and second clamping portions 60, 70 into the closed position. More specifically, it may be described that the two springs 57 rotationally bias the first and second clamping portions 60, 70 about the axis 51 towards each other. One of the first and second clamping portions 60, 70 may be fixedly coupled to a chassis or enclosure. In the embodiment depicted, the first clamping portion 60 may be fixedly, or unmovably, coupled to a back-plane circuit board 98 of a chassis or enclosure so as to not move relative to the chassis as shown in FIG. 3. More specifically, in this embodiment, fasteners (e.g., screws) fixedly couple the first clamping portion 60 to the back-plane circuit board 98. In this way, it may be described that the first clamping portion 60 remains stationary (e.g., at least with respect to the chassis or enclosure, which should be fixedly mounted to a rack, wall, or the like) while the second clamping portion 70 moves with respect thereto between the open and closed positions.

To move the first and second clamping portions 60, 70 from the closed position, which they biased thereto, the connector device 50 further includes a shape memory alloy (SMA) actuator 100 operably coupling the first and second clamping portions 60, 70 to pivotally move the first and second clamping portions 60, 70 about the axis 51 into the open position as shown in FIG. 4B. The SMA actuator 100 may include a plurality of SMA wires 102 and each of the SMA wires 102 may be operably coupled to each of the first and second clamping portions 60, 70 so as to be able to "pull" each of the first and second clamping portions 60, 70 away from each other from the close position into the open position. Although, in the embodiment depictures, the SMA actuator 100 includes two SMA wires 102, it is to be understood the SMA actuator 100 could include more or less SMA wires 102 such, e.g., a single SMA wire or three or more SMA wires (e.g., depending on the force required to overcome the bias provided by the springs 57). Further, the SMA wires 102 may include one or more materials such as, for example, copper-aluminum-nickel, nickel-titanium (NiTi), Iron-Manganese-Silicon, Copper-Zinc-Aluminum, Copper-Aluminum-Nickel, and any combination thereof. Additionally, the SMA wires 102 may be formed of various structures such as layers, etc. In one or more embodiments, the SMA wires 102 may be achieved, or formed, using SMA bilayers or composites. Additionally, it is be understood that, although the SMA wires 102 are referred to as "wires," such terminology does not have necessarily have any bearing on the shape of the SMA wires 102. For example, the SMA wires 102 may or may not have a circular cross-section (e.g., may have a square or rectangular cross section). In one embodiment, the SMA wires 102 are bands defining a width greater than a thickness.

In the embodiment depicted, each of the first and second clamping portions 60, 70 further includes first bar structures 61, 71 and second bar structures 63, 73 extending from the first end region 52 to the second end region 53. The SMA wires 102 are attached to the first bar structures 61, 71 of the first and second clamping portions 60, 70 using hooks 104 (or any other equivalent coupling) and wrap around the second bar structures 63, 73.

Generally, the SMA wires 102 may define a pre-deformation shape that will move the first and second clamping portions 60, 70 into the open position. The normal operating temperatures when the SMA wires 102 may be in a deformed state and the temperatures at which the SMA wires 102 may be heated to move into the pre-deformed state may vary depending on the materials of the SMA wires 102 (e.g., the materials that form, or make up, the SMA wires). When at normal operating temperature, the SMA wires 102 may be in a deformed state that does not pivotally move the first and second clamping portions 60, 70 into the open position. The deformation, or deformed state, of the SMA wires 102 may be caused by the springs 57 acting on the first and second clamping portions 60, 70. When the SMA wires 102 are heated to be warmer than the normal operating temperature, the SMA wires 102 may move into the pre-deformed state thereby pivotally moving the first and second clamping portions 60, 70 into the open position.

The SMA wires 102 may be heated by applying a current to the SMA wires 102 using circuitry and controller 120 as diagrammatically depicted in FIG. 1. The circuitry and controller 120 may include one or more processors, wires, power sources, and various circuitry to provide the functionality described herein. In particular, the circuitry and controller 120 are configured to selectively move the first and second clamping portions 60, 70 into the open position on command. For example, when a user is inserting a new storage or processing device into a slot of a chassis, the user may issue a first command to initiate the opening of the device connector 50 by providing input to the circuitry and controller 120. Upon insertion of the new storage or processing device, may issue a second command to initiate the closing of the device connector 50 by providing input to the circuitry and controller 120.

In other embodiments, the SMA wires 102 may be heated through various other apparatus, devices, and/or techniques. For example, a heater coil may heat the SMA wires 102 to move them into the pre-deformed state thereby pivotally moving the first and second clamping portions 60, 70 into the open position. Further, for example, a high frequency magnetic field may be may applied to the SMA wires 102 to heat the SMA wires 102 to move them into the pre-deformed state thereby pivotally moving the first and second clamping portions 60, 70 into the open position.

Although a SMA actuator is described herein, it is to be understood that the connector device 50 could utilize any type of actuator apparatus that is capable of moving the first and second clapping portions into the open and closed positions. For example, an illustrative actuator or actuator apparatus could include one more motors, one more solenoids, one more springs, etc.

Figure 5:
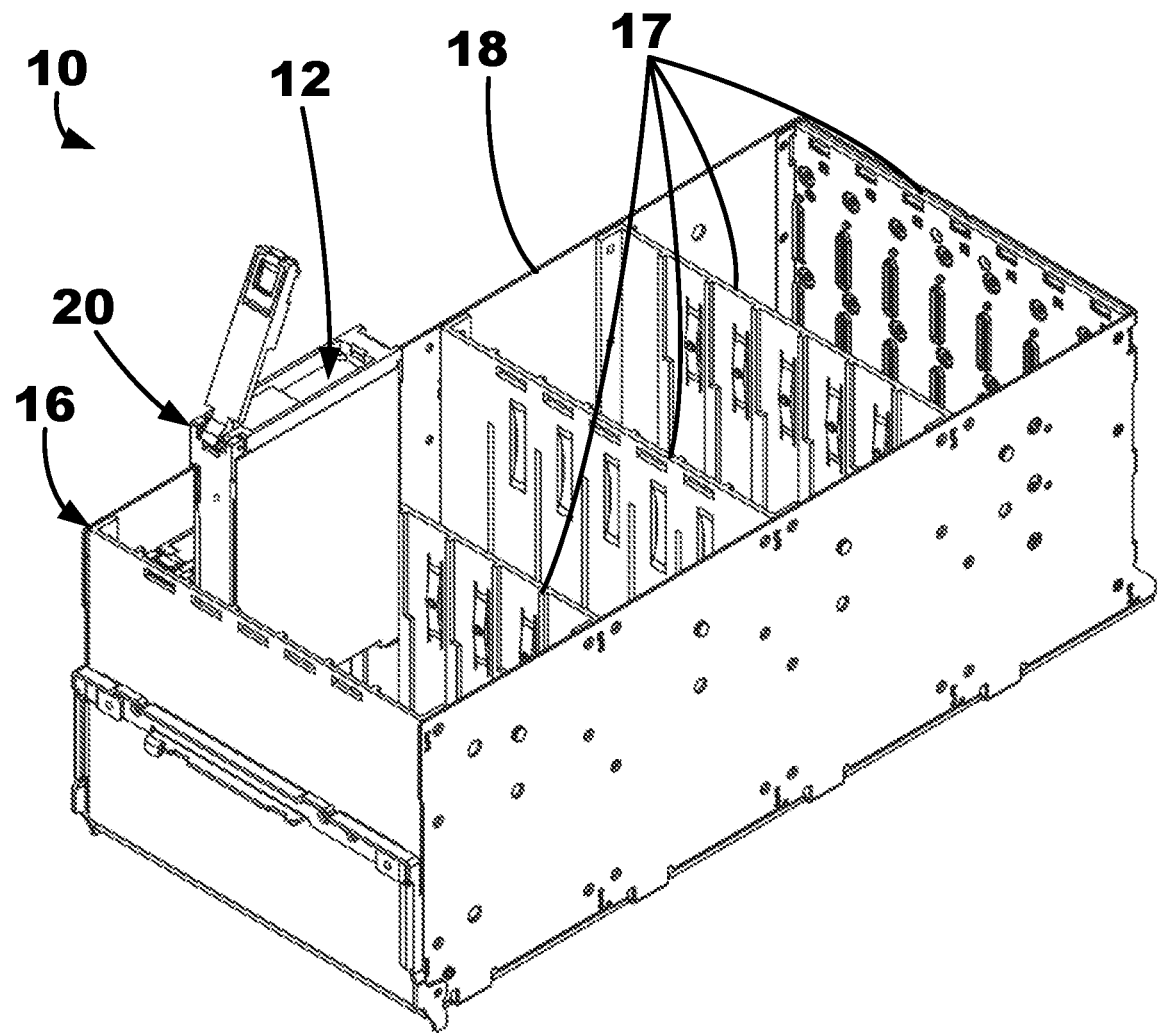
FIG. 5 is an illustrative system including a chassis for receiving a plurality of devices couplable thereto using the connector device of FIG. 1.

Although a single connector device 50 is described here and with reference to FIGS. 1-4, it is to be understood that this disclosure contemplates systems including a plurality of connector devices 50, which may be coupled or part of a chassis or enclosure system as described herein with respect to FIG. 5. Each of the plurality of connector devices or connectors 50 may be located proximate a corresponding slot to be connected to, or coupled to, a corresponding device received in the corresponding slot of the system.

An illustrative chassis, or enclosure, system 10 according to one or more embodiments is depicted in FIG. 5. As illustrated, the chassis system 10 includes a device 12 (e.g., a data storage device, a computing device, etc.) captured in a cartridge, or carrier, 20 in the process of being mounted into or unmounted from a chassis, or enclosure, 16. The chassis 16 may include a receiving frame 18 and a circuit board 98 or similar circuitry located at the bottom or back of the receiving frame 18 as depicted in FIG. 5. Although not shown, the enclosure 16 may include a shroud to cover the receiving frame 18 and any mounted cartridges 20.

The chassis 16 may be configured to receive one or more cartridges, or carriers, 20 carrying, or holding, devices 12. In some embodiments, the chassis 16 defines one or more arrays of cartridges 20 (e.g., multiple rows). Although as illustrated, only one cartridge, or carrier, 20 is shown for illustrative purposes, the cartridges 20 may be arranged in any suitable manner. In some embodiments, the cartridges 20 are in a "tombstone" arrangement, in which the cartridges 20 are inserted length-wise into the receiving frame 18 of the chassis 16. The cartridges 20 may be stacked height-wise into rows. Each row of cartridges 20 may be as wide as the cartridges 20 therein. The rows of cartridges 20 may be stacked. In this way, the chassis 16 defines a plurality of slots, each slot configured to receive a cartridge or carrier 20.

Each cartridge, or carrier, 20 may be mounted adjacent to one or more sidewalls 17 of the receiving frame 18. The sidewalls 17 may be engaged by the cartridges 20 to secure the captured devices 12 to the chassis 16. One or more sidewalls 17 may also separate the rows of cartridges 20 within the chassis 16.

A user may position or at least partially dispose the cartridges 20 within the receiving frame 18 until the cartridges 20 are mounted to the chassis 16. In one or more embodiments, it may be described that the cartridges 20 are configured to allow the user to control the mounting process by handling the cartridges 20 as opposed to the devices 12 contained therein.

After being positioned in the chassis 16, a user may secure the cartridges 20 to the receiving frame 18 to complete the mounting process. The cartridges 20 may be secured to the receiving frame 18 at least partially using the connector devices 50 described herein so as to establish a connection or operable coupling from the devices 12 to the circuit board 98 of the chassis 16. In one or more embodiments, the devices 12 are operably connected to the circuit board 98 such as e.g., a midplane, back plane, etc. when mounted, for example, to transfer data or power using the connector devices 50.

Additionally, although the chassis 10 as depicted in FIG. 5 is configured to receive cartridges or carriers 20, each of which house or include a device 12, it is to be understood that the present disclosure contemplates an illustrative chassis that receives devices 12 without the use of cartridges 20. Thus, an illustrative chassis may receive the devices 12 directly, operably couple the devices 12 directly to one or more circuit boards 98 of the chassis upon insertion of the devices 12 into the slots and use of the connector devices 50 described herein with reference to FIGS. 1-4.

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise. As used herein, "or" is generally employed in its sense including "and/or" unless the content clearly dictates otherwise. As used herein, "have," "having," "include," "including," "comprise," "comprising," or the like are used in their open-ended sense, and generally mean "including, but not limited to."

Embodiments of the connectors, connector devices, systems, and chassis apparatus are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. A device comprising:
   first and second clamping portions pivotally coupled to each other, wherein at least one of the first and second clamping portions comprises a plurality of interconnect contacts to contact a plurality of board contacts of an insertable circuit board, wherein the first and second clamping portions are pivotally spaced away from each other to allow insertion of the insertable circuit board therebetween in an open position, wherein the first and second clamping portions are pivotally spaced closer to each other than when in the open position to contact both sides of the insertable circuit board positioned therebetween in a closed position;
   one or more springs to bias first and second clamping portions into the closed position;
   an actuator operably coupling the first and second clamping portions to pivotally move the first and second clamping portions into the open position; and
   a controller comprising one or more processors operably coupled to the actuator to selectively pivotally move the first and second clamping portions into the open position.

2. The device of claim 1, wherein the first clamping portion is fixedly coupled to a backplane circuit board.

3. A device comprising:
   first and second clamping portions pivotally coupled to each other, wherein at least one of the first and second clamping portions comprises a plurality of interconnect contacts to contact a plurality of board contacts of an insertable circuit board, wherein the first and second clamping portions are pivotally spaced away from each other to allow insertion of the insertable circuit board therebetween in an open position, wherein the first and second clamping portions are pivotally spaced closer to each other than when in the open position to contact both sides of the insertable circuit board positioned therebetween in a closed position;
   a shape memory alloy (SMA) actuator operably coupling the first and second clamping portions to pivotally move the first and second clamping portions into the open position; and
   a controller comprising one or more processors operably coupled to the SMA actuator to selectively pivotally move the first and second clamping portions into the open position.

4. The device of claim 3, wherein the first clamping portion is fixedly coupled to a backplane circuit board.

5. The device of claim 3, wherein the first and second clamping portions are biased into the closed position.

6. The device of claim 3, wherein the device further comprises one or more springs to bias first and second clamping portions into the closed position.

7. The device of claim 3, wherein the SMA actuator comprises a plurality of SMA wires, each of the SMA wires operably coupled to each of the first and second clamping portions, wherein each of the SMA wires that, when at normal operating temperature, are in a deformed state that does not pivotally move the first and second clamping portions into the open position and that, when heated, move into a pre-deformed state that pivotally moves the first and second clamping portions into the open position.

8. The device of claim 3, wherein the insertable circuit board is operably coupled to a storage device.

9. The device of claim 3, wherein the first and second clamping portions comprise a fiberglass reinforced epoxy resin.

10. The device of claim 3, wherein the first and second clamping portions comprise a flex circuit with a metal backing.

* * * * *